United States Patent
Ikuta

(10) Patent No.: US 7,940,826 B2
(45) Date of Patent: May 10, 2011

(54) SURFACE EMITTING LASER

(75) Inventor: Mitsuhiro Ikuta, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 229 days.

(21) Appl. No.: 12/377,934

(22) PCT Filed: Oct. 8, 2008

(86) PCT No.: PCT/JP2008/068691
§ 371 (c)(1),
(2), (4) Date: Feb. 18, 2009

(87) PCT Pub. No.: WO2009/048159
PCT Pub. Date: Apr. 16, 2009

(65) Prior Publication Data
US 2010/0166034 A1    Jul. 1, 2010

(30) Foreign Application Priority Data
Oct. 12, 2007    (JP) .................... 2007-266246

(51) Int. Cl.
*H01S 5/00* (2006.01)
(52) U.S. Cl. ......... 372/46.014; 372/45.01; 372/50.11; 372/50.124; 372/98; 372/108
(58) Field of Classification Search .......... 372/45.01, 372/46.014, 50.11, 50.124, 99, 108
See application file for complete search history.

(56) References Cited

U.S. PATENT DOCUMENTS

| | | | |
|---|---|---|---|
| 6,704,343 B2 * | 3/2004 | Deng et al. ............. | 372/97 |
| 7,031,360 B2 | 4/2006 | Ledentsov et al. ............. | 372/43 |
| 7,499,481 B2 | 3/2009 | Ikuta ...................... | 372/50.124 |
| 7,535,946 B2 | 5/2009 | Nagatomo et al. ......... | 372/50.124 |
| 2002/0176474 A1 * | 11/2002 | Huang et al. .............. | 372/96 |
| 2003/0152120 A1 | 8/2003 | Ledentsov et al. .......... | 372/45 |
| 2004/0013157 A1 | 1/2004 | Deng et al. ................. | 372/97 |
| 2005/0117623 A1 | 6/2005 | Shchukin et al. ........... | 372/97 |
| 2008/0107145 A1 | 5/2008 | Hori et al. ................. | 372/99 |
| 2009/0034572 A1 | 2/2009 | Ikuta ..................... | 372/46.013 |
| 2009/0035884 A1 | 2/2009 | Ikuta .......................... | 438/29 |
| 2009/0086786 A1 | 4/2009 | Ikuta ....................... | 372/50.12 |

FOREIGN PATENT DOCUMENTS

| | | |
|---|---|---|
| EP | 1 098 375 A1 | 5/2001 |
| WO | WO 2007/119761 A2 | 10/2007 |

OTHER PUBLICATIONS

H.T. Hattori et al., "Analysis of hybrid photonic crystal vertical cavity surface emitting lasers," Optics Express, vol. 11, No. 15, Jul. 28, 2003, pp. 1799-1808.

(Continued)

*Primary Examiner* — Minsun Harvey
*Assistant Examiner* — Yuanda Zhang
(74) *Attorney, Agent, or Firm* — Fitzpatrick, Cella, Harper & Scinto

(57) ABSTRACT

When configuring a surface emitting laser by a semiconductor material not capable of largely extracting a refractive-index difference, the surface emitting laser using a photonic crystal capable of forming a waveguide is provided.

12 Claims, 9 Drawing Sheets

OTHER PUBLICATIONS

B.B. Bakir et al., "Surface-emitting microlaser combining two-dimensional photonic crystal membrane and vertical Bragg mirror," Applied Physics Letters, vol. 88, Feb. 24, 2006, pp. 081113-1-081113-3.

N.N. Ledentsov et al., "Novel concepts for injection lasers," Optical Engineering, vol. 41, No. 12, Dec. 2002, pp. 3193-3202.

N.N. Ledentsov et al., "Unique Properties of Quantum Dot Lasers," Nanotechnology, pp. 360-363, IEEE-Nano 2003, Third IEEE Conference on Nanotechnology.

N.N. Ledentsov et al., "Novel Approaches to Semiconductor Lasers," Proceedings of the SPIE, vol. 4905, Jan. 1, 2002, pp. 222-234.

* cited by examiner

US 7,940,826 B2

SURFACE EMITTING LASER

TECHNICAL FIELD

The present invention relates to a surface emitting laser, and to a surface emitting laser that can also be used as a light source for performing a drawing on a photoconductive drum of an image forming apparatus such as a copier and a laser printer, for example.

BACKGROUND ART

In recent years, the research work regarding an optical device using a photonic crystal has been active, and a Non-Patent Document 1 discloses a technique regarding the surface emitting laser formed by a two-dimensional photonic crystal and a multilayer mirror.

Specifically, as shown in FIG. 17, a multilayer mirror 3100 made of a laminated body of Si and $SiO_2$ and a two-dimensional photonic crystal slab 3300 are provided on a Si substrate 3000 through a clad layer 3200 made of $SiO_2$.

This two-dimensional photonic crystal slab is made of $In_{0.53}Ga_{0.47}As$, a barrier layer of InP, and a quantum well layer of $InAs_{0.65}P_{0.35}$. In this configuration, an average refractive-index of the slab is presumed to be approximately 3.2.

The two-dimensional photonic crystal slab 3300 at the side opposite to the substrate 3000 contacts an air (refractive-index 1.0).

Further, the refractive-index of the clad layer (lower clad layer) 3200 made of $SiO_2$ adjacent to the two-dimensional photonic crystal slab 3300 at the substrate side is approximately 1.4.

In this manner, since the air, which is a refractive-index medium lower than the slab, and the clad layer 3200 are provided at both sides of the slab, the slab forms a slab waveguide.

In this slab waveguide, a light emitting active layer is buried, and by a DFB action of the two-dimensional photonic crystal, the light generated by the active layer resonates in the in-plane direction of the slab, and performs a laser oscillation.

Since a secondary diffracted light of the light laser-oscillated by the two-dimensional photonic crystal is extracted in the vertical direction to the substrate, the surface emitting laser can be realized.

Further, between the slab and the substrate, the multilayer mirror in which an optical thickness of each layer is formed by $\lambda/4$ ($\lambda$ indicates a resonance wavelength) is installed. Here, the optical thickness means a thickness of a certain layer multiplied by a refractive-index of the material configuring that layer.

This multilayer mirror 3100 not only improves light extraction efficiency by returning the light radiated to the substrate side from the slab, but also controls an oscillation mode in the slab resonator.

By appropriately taking the distance between the slab 3300 and the multilayer mirror 3100, a Q value of the resonator can be controlled. For example, it is disclosed that by increasing the Q value, the threshold value of the laser can be decreased.

[Non-Patent Document 1] APPLIED PHYSICS LETTERS 88, 081113 (2006)

DISCLOSURE OF THE INVENTION

The prior art realizes the slab waveguide by nipping the slab 3300 containing the photonic crystal and the active layer by the clad layer 3200 lower in the refractive-index and the air. That is, the upper side clad layer is an air of approximately 1 in refractive-index, and the lower clad layer is $SiO_2$ of 1.4 in refractive-index.

Here, the lower clad layer 3200 is desirably formed by a semiconductor layer that can be epitaxially grown from the substrate 3000 to the active layer. However, a combination of lattice-matched semiconductors is limited, and in general, the refractive-index among these semiconductors has a value close to each other. Hence, it is difficult to secure a difference of the refractive-index between the slab and the clad layer.

On the other hand, the semiconductor slab layer formed with the photonic crystal by the formation and the like of a periodic hole, before than that the photonic crystal is formed, is decreased in effective refractive-index. Hence, it becomes more difficult to secure the refractive-index difference between the slab layer and the clad layer.

In particular, to increase the diffraction efficiency at the photonic crystal, it is desirable to enlarge the hole, but if the hole is made larger, the effective refractive-index of the photonic crystal region containing the hole is further reduced.

In this manner, when the semiconductor material is used, the increasing of the refractive-index difference between the photonic crystal layer and the clad layer is accompanied with a great difficulty.

Consequently, by the refractive-index difference between the slab layer containing the photonic crystal and the semiconductor lower clad layer, it is extremely difficult to form the slab waveguide using the light containment similarly to the prior art.

Particularly, in GaN—AlGaInN system presumed to be helpful to realize a blue semiconductor laser, there is no material available that satisfies the relationship between the lattice alignment and the refractive-index difference, and this problem arises prominently.

In view of the above described problems, the present invention aims at providing a surface emitting laser using a photonic crystal capable of forming a waveguide even when using a semiconductor material unable to largely extract a refractive-index difference.

The present invention is directed to a surface emitting laser of an oscillation wavelength $\lambda$ formed by laminating a plurality of semiconductor layers containing a first semiconductor multilayer mirror, an active layer, and a photonic crystal having a refractive-index distribution in the in-plane direction of a substrate on the substrate, wherein the photonic crystal is configured to be diffracted into a first diffracted light and a second diffracted light which is different in diffraction angle from the first diffracted light when an incident light of the oscillation wavelength $\lambda$ from a vertical direction to the in-plane is incident, and wherein the first semiconductor multilayer mirror has a stop band for each of the first diffracted light and the second diffracted light which are diffracted by the photonic crystal.

The first semiconductor multilayer mirror can have a period of the refractive-index distribution corresponding to the first diffracted light and a period of the refractive-index distribution corresponding to the second diffracted light.

The first diffracted light can have an angle of zero degree with the incident direction of the incident light, and the second diffracted light can have an angle with the incident direction of the incident light larger than zero degree and less than 90 degrees. In the surface emitting laser, when an incident angle of the second diffracted light to a normal line of the first semiconductor multilayer mirror is taken as $\theta$, a layer configuring the first semiconductor multilayer mirror can have a thickness which is not an optical thickness of $\lambda/4$, and moreover, is not an optical thickness of $\lambda/(4\cdot\cos\theta)$.

The first semiconductor multilayer mirror can be formed by alternatively laminating a layer having the first refractive-index and a layer having a second refractive-index different from the first refractive-index.

The first semiconductor multilayer mirror can be formed by laminating layers having three or more types of the refractive-index.

A reflectance for the first and second diffracted lights in the first semiconductor multilayer mirror can be 90% or more, in particular, 99% or more.

In the surface emitting laser, a second semiconductor multilayer mirror can be provided between the active layer and the photonic crystal.

The second semiconductor multilayer mirror can have a structure such that the reflectance when a light of the oscillation wavelength $\lambda$ is vertically incident on the second semiconductor multilayer mirror is higher than the reflectance when incident at another incident angle.

The present invention is directed to a surface emitting laser of an oscillation wavelength $\lambda$ formed by laminating a plurality of semiconductor layers containing a first semiconductor multilayer mirror, an active layer, and a photonic crystal having a refractive-index distribution in the in-plane direction of a substrate on the substrate, wherein the photonic crystal is configured to be diffracted into a first diffracted light and a second diffracted light which is different in diffraction angle from the first diffracted light when an incident light of the oscillation wavelength $\lambda$ from a vertical direction to the in-plane is incident, and wherein the first semiconductor multilayer mirror is configured to be able to be reflected on each of the first diffracted light and the second diffracted light which are diffracted by the photonic crystal, and when the refractive-index of the active layer is taken as $n_1$ and the refractive-index of a dielectric, to which the photonic crystal contacts at a boundary face opposite to the substrate side, is taken as $n_2$, a difference of the incident angle with a first reflectance peak showing the highest reflectance, and a second reflectance peak showing the same reflectance as the first reflectance peak or the highest reflectance next to the first reflectance peak is configured to exceed $\arcsin(n_2/n_1)$.

The dielectric can be air.

The first semiconductor multilayer mirror can have a period of the refractive-index distribution corresponding to the first diffracted light and a period of the refractive-index distribution corresponding to the second diffracted light.

According to the present invention, even when the semiconductor material unable to largely extract a refractive-index difference is used, a surface emitting laser using a photonic crystal capable of forming a waveguide can be provided.

Further feature of the present invention will become apparent from the following description of exemplary embodiments with reference to the attached drawings.

BEST MODE FOR CARRYING OUT THE INVENTION

According to the configuration of the present invention, even when a refractive-index difference between a slab layer and a clad layer is unable to largely extract, a waveguide can be formed. This is realized by providing a lower semiconductor multilayer mirror reflecting at high reflectance an oblique incident light obliquely emitted from a slab layer having a photonic crystal. That is, if configured in this manner, by the reflection by the boundary face with the air and the semiconductor, and by the reflection by the semiconductor multilayer mirror, it is possible to allow a waveguide mode with a photonic crystal layer, an upper spacer layer, and a lower spacer layer as a waveguide to exist.

Further, according to the configuration of the present invention, it is possible to realize a low threshold value, while suppressing a resonator volume. This is realized by configuring one lower semiconductor multilayer mirror (first semiconductor multilayer mirror) having a high reflectance relative to a diffracted light 260 (first diffracted light) incident from a vertical direction shown in FIG. 2 and a diffracted light 270 (second diffracted light) different from the diffracted light 260 in diffraction angle.

That is, if configured in this manner, by one lower semiconductor multilayer mirror, it is possible to reflect, for example, both of an incident light from the vertical direction and an incident light from the direction of an θ angle at high reflectance. Hence, there is no need for a plurality of semiconductor multilayer mirrors corresponding to the incident lights by each incident angle, and it is possible to suppress a resonator volume.

(Basic Structure)

The basic structure will be described in detail below based on embodiments of the present invention.

Figure 1:
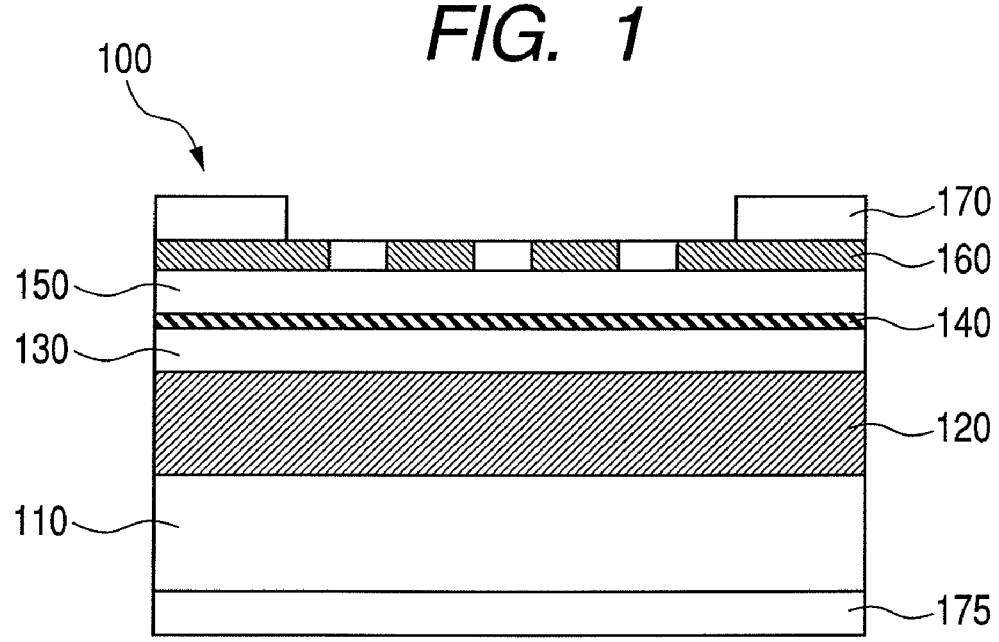
FIG. 1 is a sectional schematic illustration for describing a surface emitting laser in the embodiments of the present invention.

In FIG. 1 is shown a sectional schematic illustration for describing a surface emitting laser of the present embodiment.

In FIG. 1, reference numeral 100 denotes a surface emitting laser, numeral 110 a substrate, numeral 120 a lower semiconductor multilayer mirror (first semiconductor multilayer mirror), numeral 130 a lower spacer layer, numeral 140 an active layer, numeral 150 an upper spacer layer, and numeral 160 a slab layer provided with a photonic crystal structure.

In the surface emitting laser of the present embodiment, each layer including the lower semiconductor multilayer mirror 120 is laminated vertically to the in-plane direction of the substrate 110.

The active layer 140, for example, has a multiple quantum well structure, and emits light by injecting carriers.

Further, here, the slab layer provided with the photonic crystal structure means a one-dimensional or a two-dimensional layer having a periodic refractive-index change in a parallel direction to the substrate.

Further, numerals 170 and 175 denote an electrode, and by applying the voltage between these electrodes, the active layer 140 is injected with carriers so as to emit light.

(Photonic Crystal Structure and Lower Semiconductor Multilayer Mirror)

Figure 2:
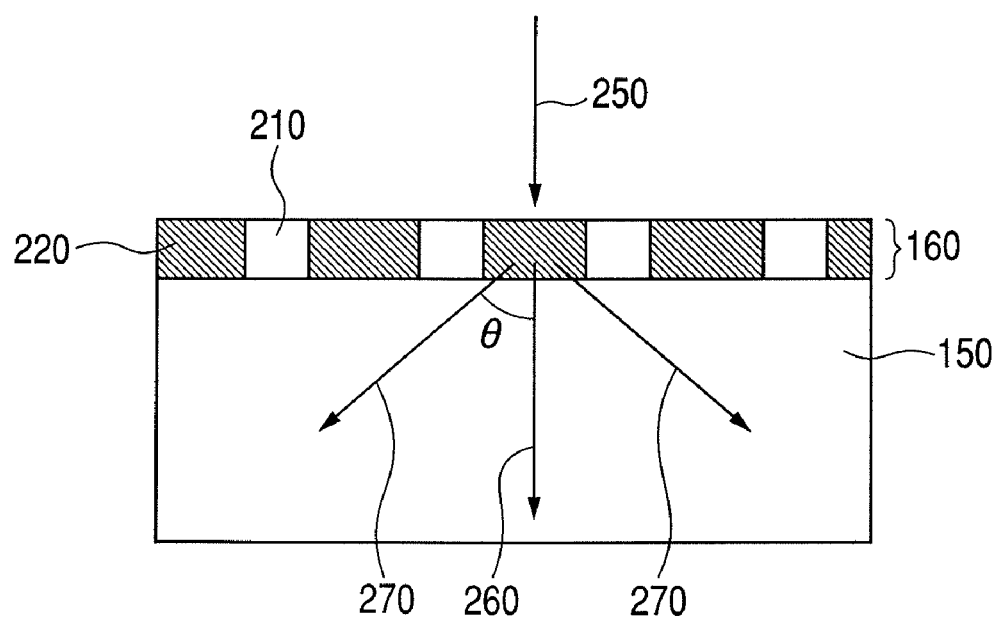
FIG. 2 is a sectional schematic illustration by a slab layer and an upper spacer layer provided with a photonic crystal structure for describing the function of a lower semiconductor multilayer mirror in the embodiments of the present invention.

Next, by using FIG. 2, a function of the lower semiconductor multilayer mirror 120 in the present embodiment will be described. FIG. 2 is a sectional schematic illustration of the slab layer 160 and the upper spacer layer 150 provided with the photonic crystal structure.

In FIG. 2, in the in-plane direction of the slab layer 160, a pore 210 and a region 220 separating the pore 210 are provided, and a photonic crystal structure is formed. Numeral 250 denotes an incident light incident in the vertical direction to the slab layer 160 having the photonic crystal structure. The incident light 250 is divided by the slab layer 160 into a diffracted light 260 (first diffracted light) incident in the vertical direction to the lower semiconductor multilayer mirror 120 and a diffracted light 270 (second diffracted light) incident from the direction of an angle θ to the lower semiconductor multilayer mirror 120.

In the present embodiment, when the light incident on the slab layer containing the photonic crystal structure by an oscillation wavelength λ is separated into a first diffracted light 260 and a second diffracted light 270 by diffraction so as to enter the lower semiconductor multilayer mirror 120, the lower semiconductor multilayer mirrors capable of reflecting both of these first and second diffracted lights at high reflectance is formed. Thereby, a plurality of semiconductor multilayer mirrors corresponding to the incident lights by respective incident angles are not required, so that the resonator volume can be suppressed. The details thereof will be described later.

Here, the angle θ (angle made by the incident direction of the incident light 250 and the second diffracted light 270) which is an angle by which the second diffracted light 270 enters the lower multilayer mirror 120 is larger than 0° and not more than 90°.

Figure 3:
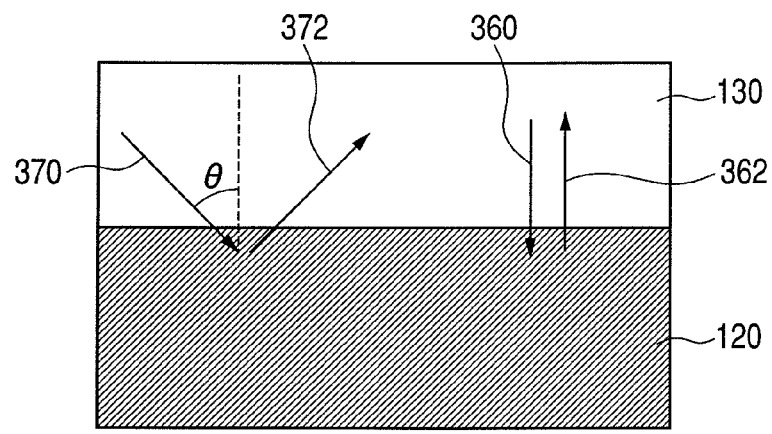
FIG. 3 is a sectional schematic illustration by a lower spacer layer and a lower semiconductor multilayer mirror for describing the function of a lower semiconductor multilayer mirror in the embodiments of the present invention.

FIG. 3 is a sectional schematic illustration of the lower spacer layer 130 and the lower semiconductor multilayer mirror 120 in the present embodiment.

Reference numeral 360 denotes a vertical incident light equivalent to the first diffracted light 260, and numeral 370 an oblique incident light equivalent to the second diffracted light 270.

Numerals 362 and 372 are the reflection lights whose incident lights 360 and 370 are reflected by the semiconductor multilayer mirror 120.

In general, the semiconductor multilayer mirror is designed such that the reflectance becomes the highest for the light of the resonance wavelength vertically incident.

Figure 7:
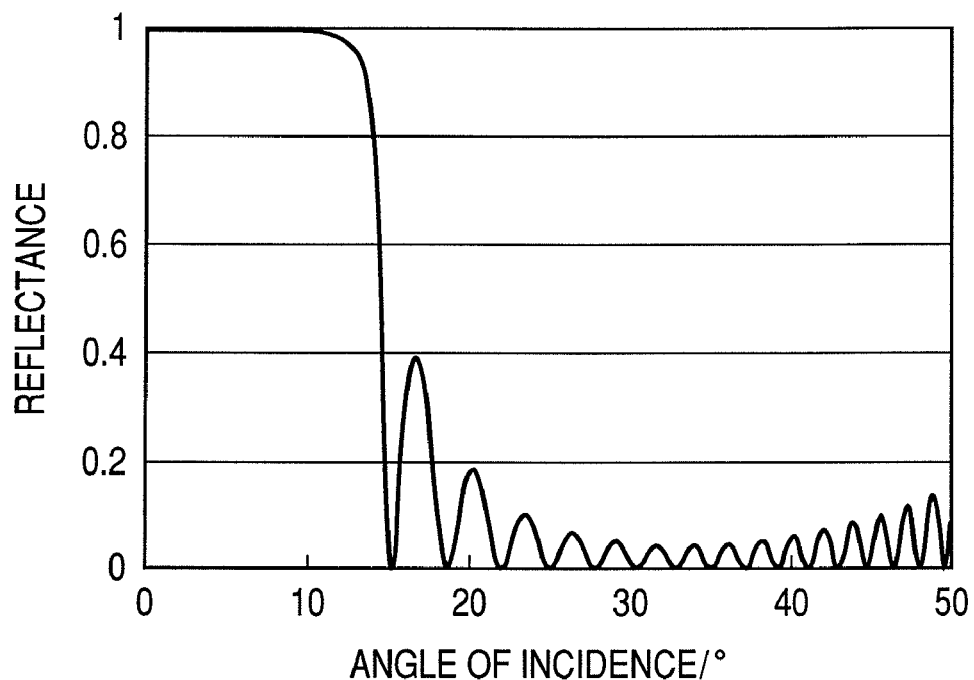
FIG. 7 is a view for describing the reflectance when a light of the wavelength of $\lambda$ is incident at an incident angle $\theta$ on the semiconductor multilayer mirror in the embodiments of the present invention.

Specifically, the high refractive-index layer and the low refractive-index layer are alternatively laminated, thereby to form the semiconductor multilayer mirror so that the optical thicknesses of the layers become λ/4, respectively, for the laser oscillation wavelength λ. The reflectance when the light of the wavelength of λ is incident on such semiconductor multilayer mirror at an incident angle θ is, for example, as shown in FIG. 7, high in reflectance in the vicinity of θ=0°, and is low in reflectance at other incident angles.

In contrast to this, the lower semiconductor multilayer mirror 120 in the present embodiment is configured such that not only the reflectance for the vertical incident light 360, but also the reflectance for the oblique incident light 370 are high for the incident light of the wavelength λ.

At that time, these reflectances are preferably high in order to reach the point of laser oscillation, and both of the reflectances are desirable to be not less than 90%. Further, from this view point, it is desirable to be set not less than 99%, and the reflectance closer to 100% is most desirable.

(Waveguide Mode)

The resonance mode of this surface emitting laser will be described by using FIG. 4 by using ray approximation. This surface emitting laser is configured such that a resonance mode obliquely resonating is present inside the waveguide formed by the photonic crystal structure and the lower semiconductor multilayer mirror.

The photonic crystal 160 and the semiconductor multilayer mirror 120 add an in-plane resonance operation to the waveguide mode whose waveguide area contains the active layer 140.

Figure 4:
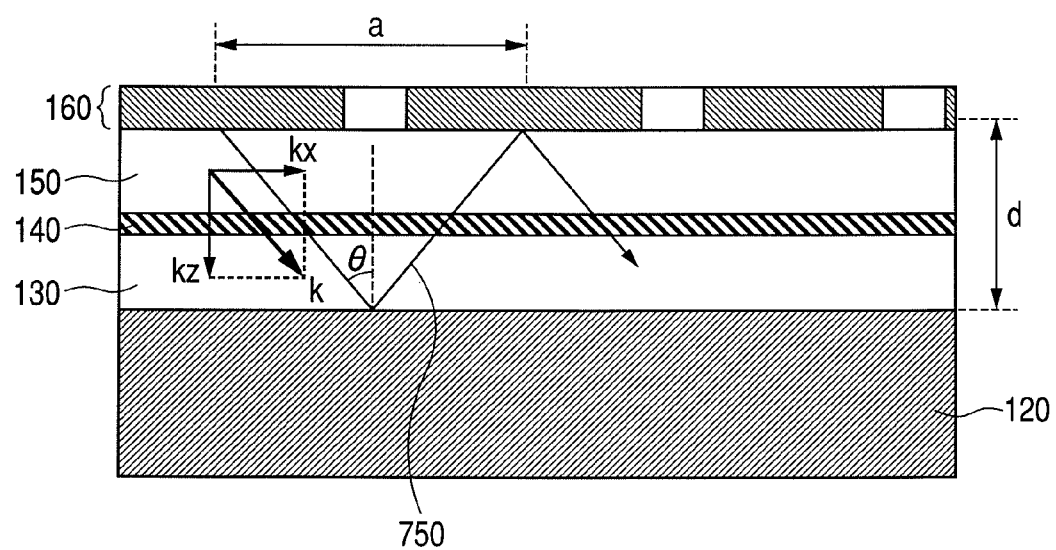
FIG. 4 is a sectional schematic illustration for describing a design method of the distance in the upper surface of the slab layer containing a photonic crystal and the upper surface of the lower semiconductor multilayer mirror in the embodiments of the present invention.

Here, similarly to FIG. 4, a light 750 guided through a surface xz and in a resonant state is considered. Here, the light 750 in a resonant state contains a light 270 of FIG. 2, a light 370 and a light 372 of FIG. 3. Further, symbol x indicates a substrate in-plane direction, and symbol z indicates a substrate vertical direction. A z component of a wave number vector k of the light of the wavelength λ in a resonant state is taken as kz, and a x component is taken as kx.

With respect to the light 750 in the resonant state, from the waveguide condition (condition in which a standing wave rises in a z direction), the following formula is established.

$$n \cdot d \cdot k_z + \phi = 1\pi \text{ (1 is an integer)} \qquad (1)$$

Further, from the resonance condition (diffraction condition of the vertical incident lights 250 and 750), the following formula is established.

$$n \cdot a \cdot k_x = 2m\pi \text{ (m is an integer)} \qquad (2)$$

Here, n represents an effective refractive-index of a waveguide layer, d represents an effective waveguide layer thickness, a represents a lattice constant of the photonic crystal, and φ represents a phase shift (Goos-Hanchen shift) at the time of reflection.

Here, for convenience of description, let us assume that m=1, and φ=0.

Now, if λ is taken as a laser resonance wavelength, and θ is taken as an incident angle to the semiconductor multilayer mirror, then, kz=2 π cos θ/λ, and kx=2 π sin θ/λ.

Here, when the formula (1) and the formula (2) are solved for λ and θ, then, $\lambda = n/\sqrt{(1/a)^2 + (1/2d)^2}$, and θ=arctan(kx/kz) =arctan(2d/1a).

That is, the semiconductor multilayer mirror 120 is designed such that reflectance becomes high in the resonance wavelength λ for the diffracted light of the incident angle θ incident on the semiconductor multilayer mirror 120.

By the slab layer 160 containing the lower semiconductor multilayer mirror 120 provided with such structure and the photonic crystal structure, the surface emitting laser 100 of FIG. 1 functions as follows. Most of the lights obliquely incident on the semiconductor multilayer mirror 120 on the optical path of the incident light 370 in FIG. 3 by the light radiated from the active layer 140 are reflected by the lower semiconductor multilayer mirror 120, and are incident on the slab layer 160 containing the photonic crystal structure in the direction of the reflection light 372.

A part of this light is reflected by high refractive-index difference between the semiconductor layer and the air starting with the slab layer 160 containing the photonic crystal structure.

Further, a part of the light incident on the slab layer has an angle made with the axis vertical to the in-plane direction of the substrate and an incident optical path maintained by the photonic crystal, and for example, in the case of a tetragonal lattice structure, the part of the light is diffracted to the substrate side in the directions rotated 0°, ±90°, and 180° for the incident optical path.

The part of the light is again incident on the lower semiconductor multilayer mirror 120 as the oblique incident light 370, and is reflected again.

That is, by the reflection by the boundary face with the air and the semiconductor, and by the reflection by the semiconductor multilayer mirror, a waveguide mode with the slab layer 160 containing the photonic crystal structure, the upper spacer layer 150, and the lower spacer layer 130 as the waveguide comes to exist. That is, by the lower semiconductor multilayer mirror 120 having a high reflectance for the oblique incident light, the waveguide mode can be allowed to exist even when the clad layer having a low refractive-index is not provided at the lower side of the active layer.

Further, since the light of the waveguide mode can return to the original optical path by repeating several times the reflection and diffraction at the photonic crystal and the reflection at the lower semiconductor multilayer mirror 120, the resonance operation is generated.

The light in the resonance mode is amplified by the active layer in the resonator, and can reach the point of laser oscillation. Further, since the resonance occurs across the whole photonic crystal region, a coherent oscillation in a wide range is made possible.

Further, by placing the active layer at a position where the electromagnetic field intensity of the standing wave in the resonator is great, the laser can be given a substantial gain.

Further, by the slab layer 160 containing the photonic crystal structure, a part of the light of the waveguide mode is diffracted in the direction vertical to the substrate.

Figure 5:
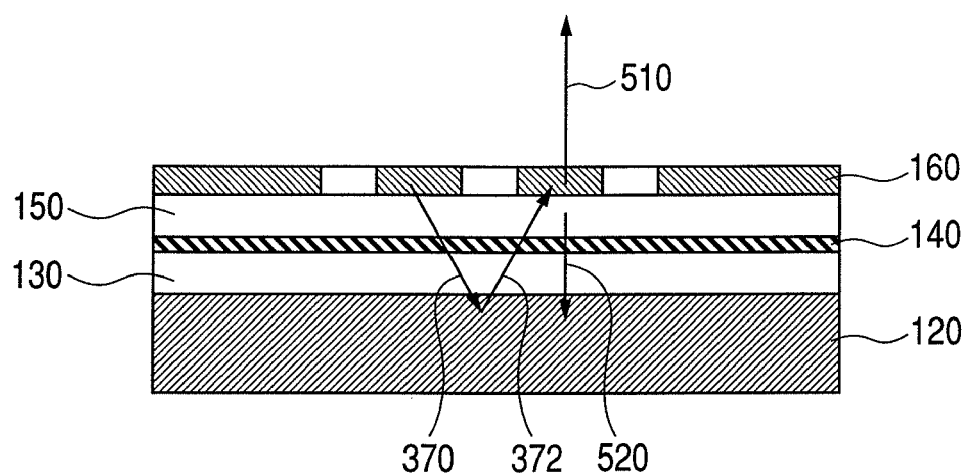
FIG. 5 is a sectional schematic illustration for describing a diffraction of the surface emitting laser in the embodiments of the present invention.

FIG. 5 is a sectional schematic illustration for describing the diffraction of the surface emitting laser of the embodiment of the present invention.

As shown in FIG. 5, the lights diffracted by the slab layer 160 containing the photonic crystal include a light 520 at the substrate side and a light 510 at the opposite side of the substrate.

From among these lights, by extracting the light 510 (opposite direction of the incident light 250 in FIG. 2) radiated upward, this laser functions as a surface emitting laser.

Further, the light 520 (in the direction of the first diffracted light 260 of FIG. 2) radiated downward is incident on the lower semiconductor multilayer mirror 120 as a vertical incident light, and is reflected, and is returned to the resonance waveguide side and the photonic crystal layer side.

By this operation, the value Q of the resonance mode of the resonator formed by the slab layer 160 containing the photonic crystal structure and the lower semiconductor multilayer mirror 120 is changed.

The phase of the reflection light vertically incident on the lower semiconductor multilayer mirror 120 is largely extracted so as to increase the Q value of the resonator by adjusting the thickness of the lower spacer layer and the layer structure of the lower semiconductor multilayer mirror 120, so that the oscillation threshold value of the surface emitting laser can be reduced.

The range of the angle θ desirably exceeds an critical angle of the total reflection at the boundary face with the waveguide layer (slab layer containing the lower spacer layer, the active layer, the upper spacer layer, and the photonic crystal structure) and the air. This is because when θ satisfies the condition, in case the light is incident on the photonic crystal structure in the direction of the diffracted light 270 (direction opposite to the arrow mark of FIG. 2), the light emitted to the opposite side of the substrate is only in the direction of the incident light 250 (direction opposite to the arrow mark of FIG. 2), and this is preferable for the actual use of the surface emitting laser.

Further, the lattice structure of the photonic crystal may be a triangle lattice structure and the like, though a description has been made on the tetragonal lattice structure.

Further, the pore diameter (means the diameter when the cross section of the pore in the in-plane direction of the substrate is a circle) is, for example, preferably approximately 40% of the lattice interval a of the photonic crystal structure. Since the diffraction efficiency changes by the pore diameter and affects light emission efficiency, the pore diameter may be appropriately set to increase the light emission efficiency.

(Resonator Volume)

Now, in the lower semiconductor multilayer mirror, the intensity distributions of the oblique incident light 370 and the vertical incident light 360 of the resonance mode become distributions that attenuate in the direction of the multilayer thickness for both of the lights.

Consequently, when the semiconductor multilayer mirrors for the oblique incident light and the vertical incident light are prepared separately, thereby forming the semiconductor multilayer mirror integrated for the oblique incident light and the vertical incident light as comparing with the case where the layers are laminated, an effective resonator volume (vertical direction to the substrate) in which the standing wave is distributed can be suppressed.

As a result, an unnecessary loss due to the size of the resonator being large can be reduced.

By the configuration thus described above, even when the refractive-index difference between the waveguide and the clad layer is not much extracted, it is possible to realize the surface emitting laser using the photonic crystal of the configuration capable of injecting the current. Further, the surface emitting laser using the photonic crystal suppressing the loss by suppressing the resonator volume can be realized.

(Design Guidance of Lower Semiconductor Multilayer Mirror)

Next, the design concept of the lower semiconductor multilayer mirror 120 will be described.

The semiconductor multilayer mirror 120 has a high reflection region (referred to also as stop band or photonic band gap) for the wavelength of the incident light and the incident angle decided by its period of the refractive-index distribution.

This will be described by using a specific numerical value.

(Multilayer Mirror Having One Refractive-Index Distribution Period)

The reflectance of the semiconductor multilayer mirror made of a layer having a refractive-index $n_L=3.1$ (low refractive-index layer) and a layer having a refractive-index $n_H=3.4$ (high refractive-index layer) for the light of the wavelength $\lambda=670$ nm is considered. For example, as shown in FIG. 6, when both of the low refractive-index layer and the high refractive-index layer are alternately laminated with an optical thickness of $\lambda/4$ (167.5 nm), the reflectance when incident on this multilayer film from the matter of the refractive-index 3.4 is as shown in the graph of FIG. 7.

Figure 6:
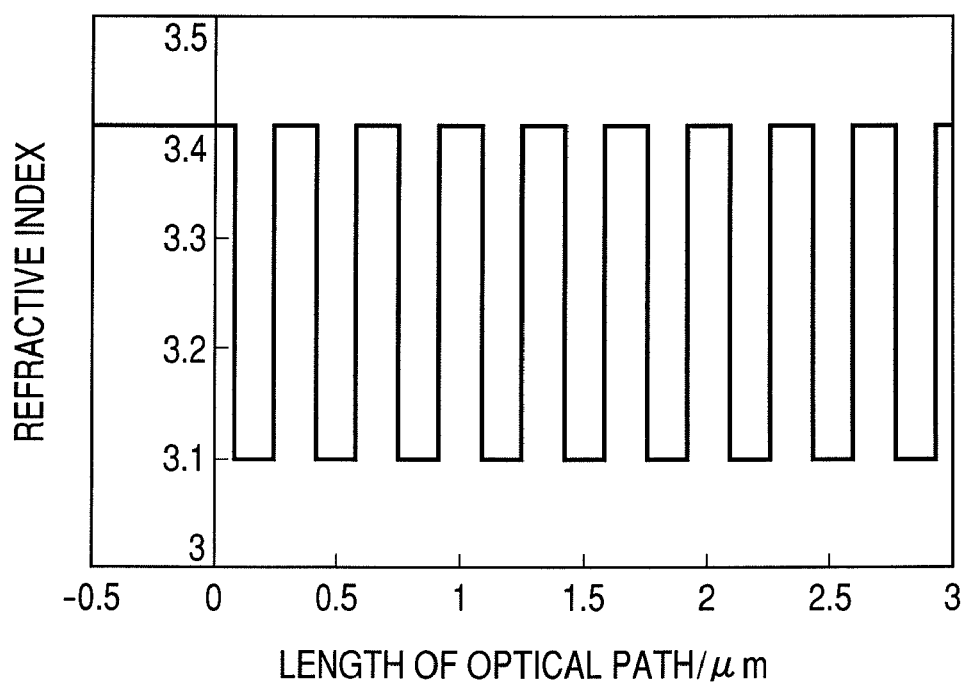
FIG. 6 is a view for describing a refractive-index distribution of the semiconductor multilayer mirror whose low refractive-index layer and high refractive-index layer are alternately laminated both at $\lambda/4$ (167.5 nm) in optical thickness in the embodiments of the present invention.

Here, the axis of abscissas of FIG. 6 represents an optical path length (length multiplying the actual distance by the diffractive index) and represents the optical path length from the surface of the semiconductor multilayer mirror. The light is incident from a region where the value shown in the axis of abscissas is negative (same applies to FIGS. 8, 10, and 12).

Figure 9:
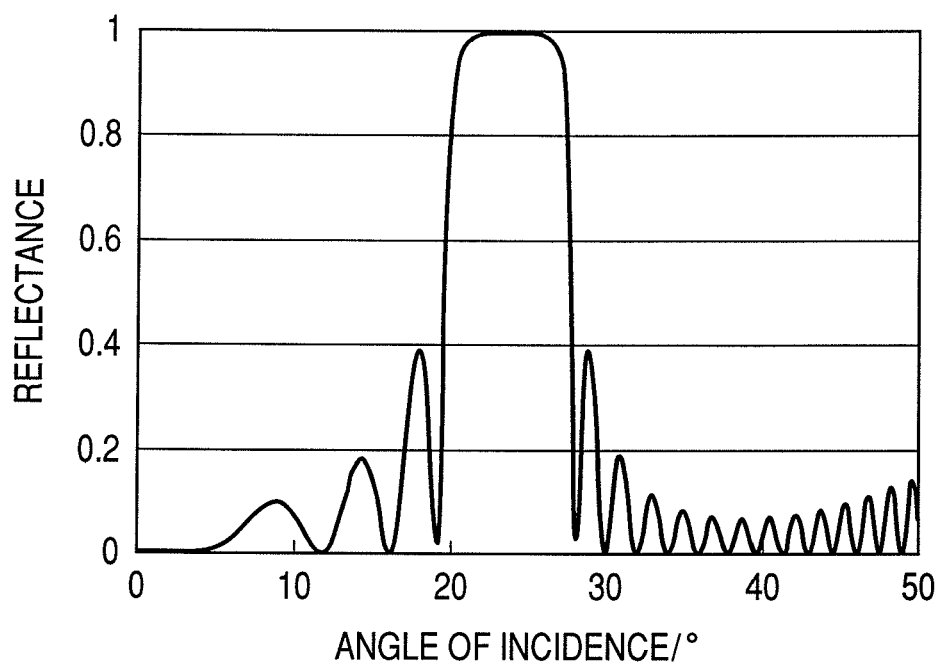
FIG. 9 is a view for describing the reflectance of the semiconductor multilayer mirror in the embodiments of the present invention.
Figure 11:
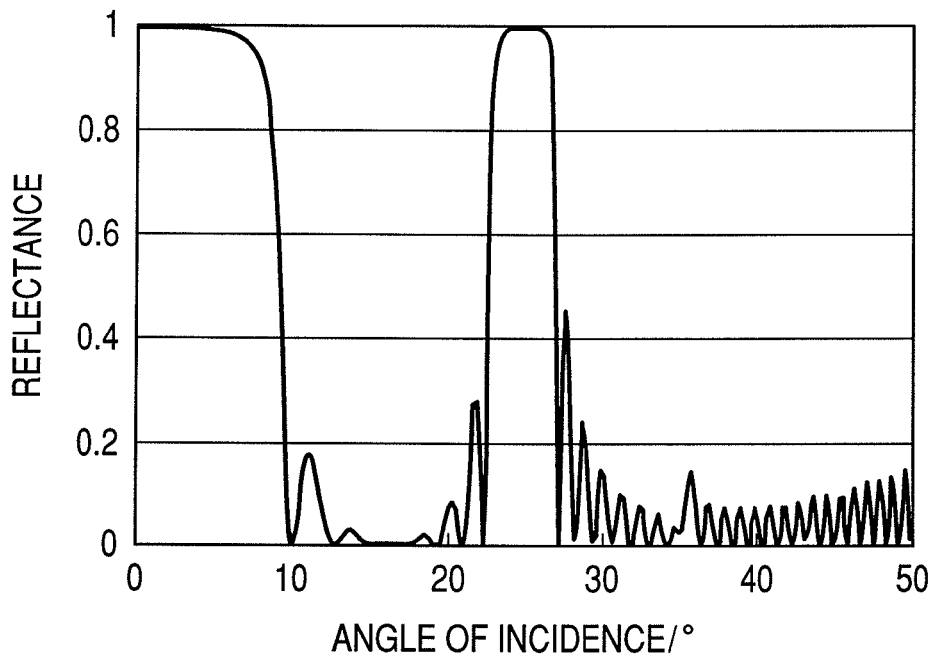
FIG. 11 is a view for describing the reflectance of the semiconductor multilayer mirror in the embodiments of the present invention.
Figure 13:
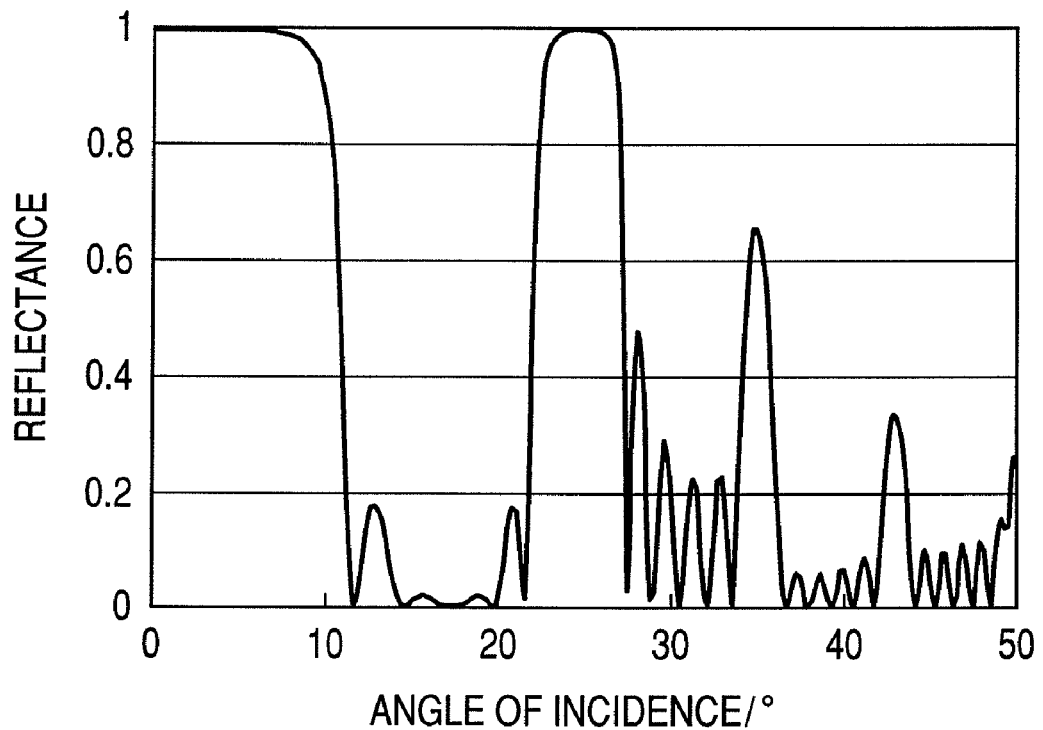
FIG. 13 is a view for describing the reflectance of the semiconductor multilayer mirror in the embodiments of the present invention.

Here, the axis of abscissas of the graph of FIG. 7 represents the incident angle θ for the normal line of the multilayer film surface, whereas the axis of ordinate represents the reflectance (same applies to FIGS. 9, 11, and 13).

Further, the number of pairs of the low refractive-index layers and the high refractive-index layers of the multilayer film is set to 40. This multilayer film becomes high in refractive-index when the light of the wavelength λ is incident vertically.

In this manner, in the so-called semiconductor multilayer mirror of a λ/4 pair, generally, the reflectance when the wavelength λ is obliquely incident does not become high.

Figure 8:
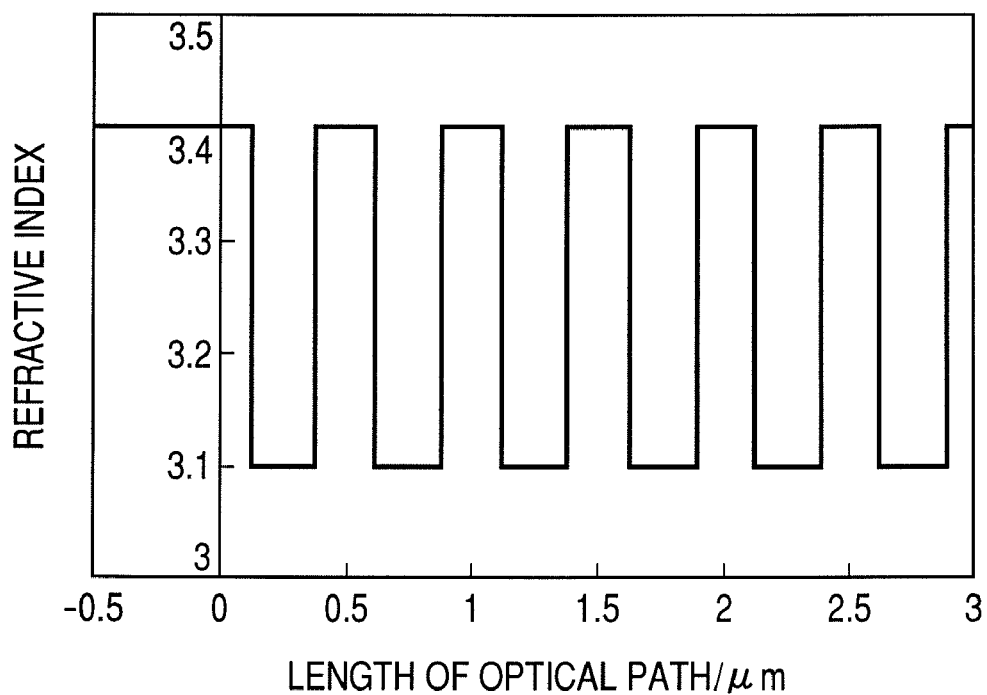
FIG. 8 is a view for describing the refractive-index distribution of the semiconductor multilayer mirror in the embodiments of the present invention.

Further, for example, as shown in FIG. 8, the semiconductor multilayer mirror when the optical thicknesses of the low refractive-index layer and the high refractive-index layer are $\lambda/(4 \cdot \cos \theta_L)$ and $\lambda/(4 \cdot \cos \theta_H)$ (here $n_L \cdot \sin \theta_L = n_H \cdot \sin \theta_H$), respectively, is considered.

Here, for example, when $\theta_H=24°$, in this semiconductor multilayer mirror, the optical path lengths of the thicknesses of the low refractive-index layer and the high refractive-index layer become 265.3 nm and 236.9 nm, respectively.

The reflectance when the light is incident at the incident angle θ from the matter of refractive-index 3.4 on the multilayer film with the number of pairs of the high refractive-index layers and the low refractive-index layers as 40 is similar to the graph of FIG. 9, and it is found that the reflectance becomes high with the incident angle in the vicinity of 24°. However, the reflectance for the vertical incident light does not become high.

In this manner, the semiconductor multilayer mirror depends on the period of the refractive-index distribution in the direction of the lamination layer, so that the wavelength of the incident light and a reflection region (photonic band gap) of the multilayer film for the incident angle are decided.

(Multilayer Mirror Having Two or More Refractive-Index Distribution Period)

Now, the lower semiconductor multilayer mirror 120 in the present embodiment, as described above, is configured such that the reflectance for the vertical incident light and the reflectance for the oblique incident light are both high. To that end, the refractive-index distribution in the direction of the laminated layer of the semiconductor multilayer mirror is required to be given two periods corresponding to the vertical incidence and the oblique incidence in the light of the laser resonance wavelength.

Figure 10:
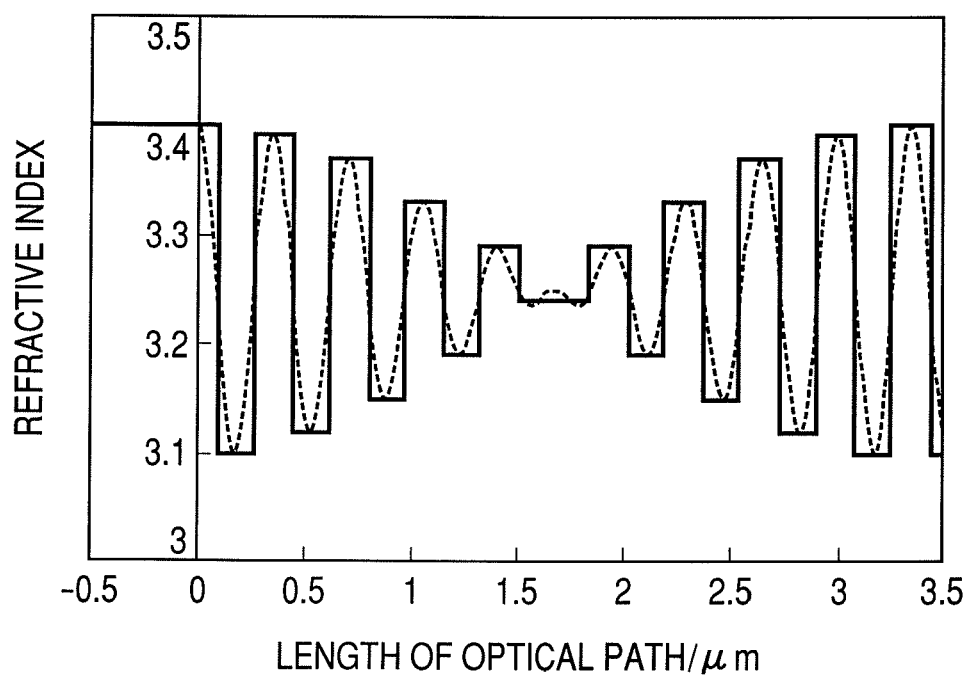
FIG. 10 is a view for describing the refractive-index distribution of the semiconductor multilayer mirror in the embodiments of the present invention.

To describe more specifically, for example, the multilayer film having the refractive-index distribution like the solid line shown in FIG. 10 is considered. In this figure, the axis of abscissas represents an optical path length, and the axis of ordinate represents a refractive-index, and the refractive-index distribution shown by the solid line is given the periods of 335 nm and 372.2 nm in optical path length. First, with respect to the function that adds up together a sine function which is a period 335 nm and a sine function which is a period 372.2 nm, a linear transformation is performed so that the minimum value of the function value becomes 3.1 and the maximum value becomes 3.4 (equivalent to the broken line in FIG. 10). Next, this function linearly transformed is approximated by several step functions. By so doing, the refractive-index distribution shown by the solid line is obtained.

In this method, since this refractive-index distribution has a space frequency component corresponding to the period 335 nm and the period 372.2 nm, the reflectance in the wavelength and the angle of the incident light corresponding to each period becomes high. Further, since the value of the refractive-index settles down between 3.1 and 3.4, by the semiconductor material corresponding to the refractive-index, this refractive-index distribution can be configured. The reflectance when the light of the wavelength $\lambda=670$ nm is incident at the incident angle θ on the multilayer mirror (laminated 26 μm in thickness by optical distance) having such a refractive-index distribution becomes as shown in FIG. 11.

The peak of the reflectance of FIG. 11 is approximately at the same place as the peak of FIG. 7 and the peak of FIG. 9 (0° and approximately 24°). This arises from allowing the multilayer mirror of FIG. 10 to have the period of the refractive-index distribution of the multilayer mirror of FIGS. 6 and 8.

If such a technique is used, by adjusting the two periods of the refractive-index distribution, the multilayer mirror can be allowed to have reflectance peaks at two suitable incident angles.

Here, while the period of the refractive-index distribution of the multilayer mirror is made two, thereby to obtain two reflectance peaks, the period may be increased to three or more, and in that case, the reflectance peaks corresponding to that number can be given.

Now, the multilayer mirror thus having plural periods for the refractive-index distribution sometimes deteriorates in the corresponding incident angle if the reflectance is compared by the same thickness, when compared with the multilayer mirror in which the refractive-index distribution has only one period. In this case, by stacking the multilayer mirror thick, the reflectance can be increased.

Further, the phases of the reflection lights at the incident angles corresponding to the two reflection peaks of this multilayer mirror and the relationship between these reflection lights can be adjusted by changing an adding method of the periods of the refractive-index distribution.

That is, when the sine waves are added up in the above described example, the phases of these sine waves may be appropriately shifted and added.

Figure 16:
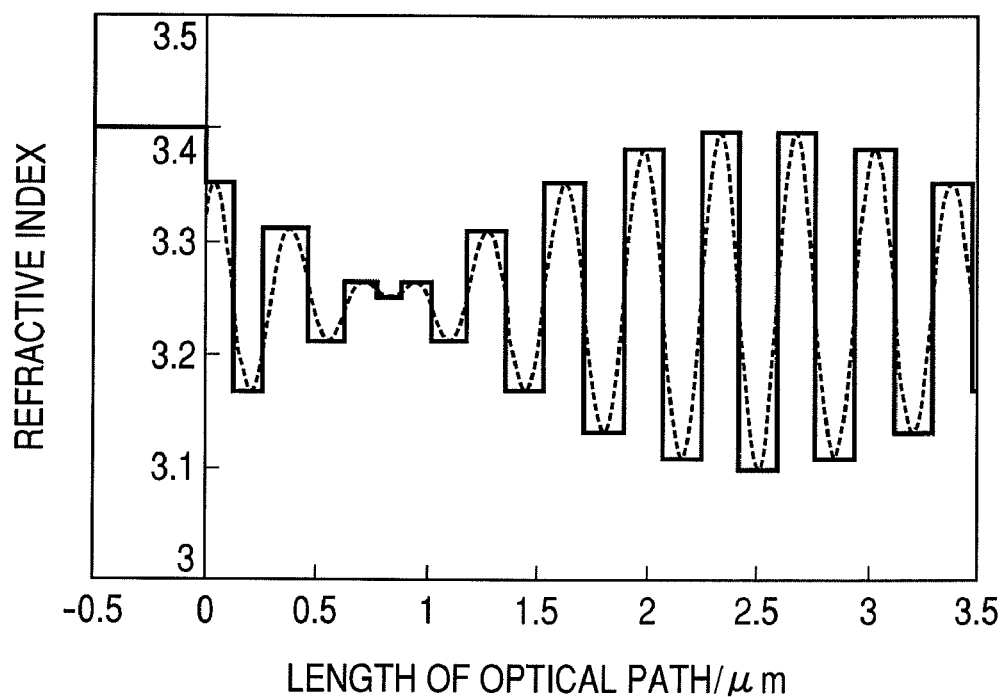
FIG. 16 is a view for describing the refractive-index distribution of the semiconductor multilayer mirror in the embodiments of the present invention.
Figure 17:
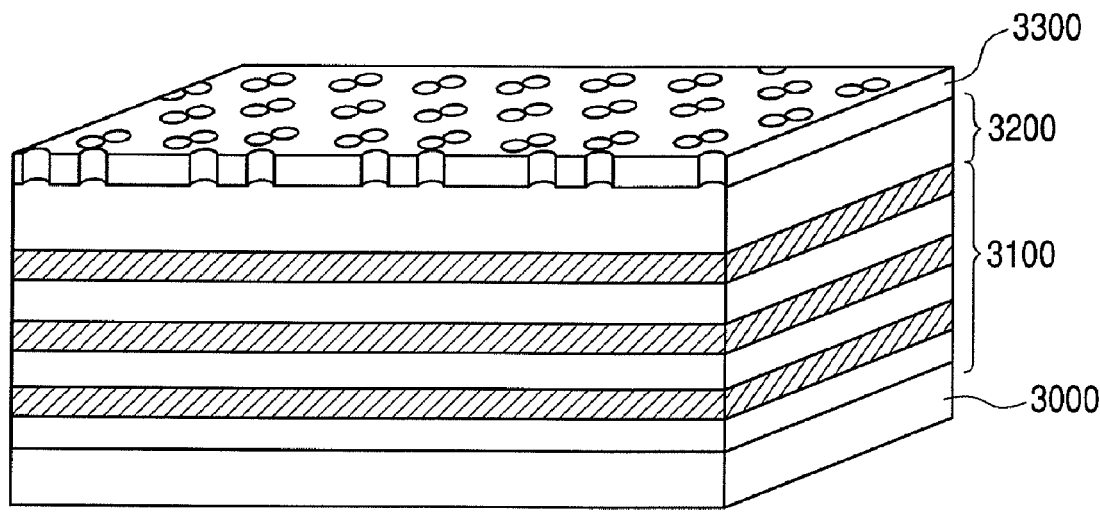
FIG. 17 is a sectional schematic illustration for describing the surface emitting laser in a Non-Patent Document 1 which is a known technique.

For example, the multilayer mirror may be configured similarly to the refractive-index distribution shown by the solid line in FIG. 16. First, with respect to the function that shifts the sine function of the period 335 nm and the sine function of the period 372.2 nm by 90° and adding them together, a linear transformation is performed so that the minimum value of the function value becomes 3.1 and the maximum value becomes 3.4 (equivalent to the broken line in FIG. 16). Next, this function linearly transformed is approximated by several step functions. By so doing, the refractive-index distribution shown by the solid line can be obtained, and the refractive-index distribution shown in FIG. 16 becomes a refractive-index distribution different from the refractive-index distribution shown in FIG. 10.

The reflection light of the light having the wavelength 670 nm which is obliquely incident at approximately 24° on the multilayer mirror formed by the refractive-index distribution of FIG. 16 is shifted in phase as compared with the reflection light of the multilayer mirror formed by the refractive-index distribution of FIG. 10.

That is, the multilayer mirror, in the reflection of the oblique incident light for the formation of the waveguide and the reflection of the vertical incident light for the control of the Q value of the resonator, can independently control the phases of the respective reflection lights. These are desirable to be made the optimum phases for the desired surface emitting laser, respectively.

Further, it is possible to make reflectances of the two reflectance peaks different. That is, by using the above described technique, an amplitude ratio of the sine wave at the time of adding up the sine waves may be adjusted, and an amplitude strength of the since wave corresponding to the peak desired to be reflected much stronger may be increased.

In this manner, by optimizing the phase relationship and the intensity ratio of the two reflection lights, the multilayer mirror 120 can be made more appropriate for the surface emitting laser.

Further, in the above described configuration example, while the refractive-index of the layer configuring the multilayer mirror has been described with respect to three types or more, it is not limited to such configuration.

That is, the multilayer mirror such as described above can be formed by using two types of the refractive-indexes. Specifically, the multilayer mirror is formed by alternately laminating a layer having the first refractive-index and a layer having the second refractive-index different from the first refractive-index.

Figure 12:
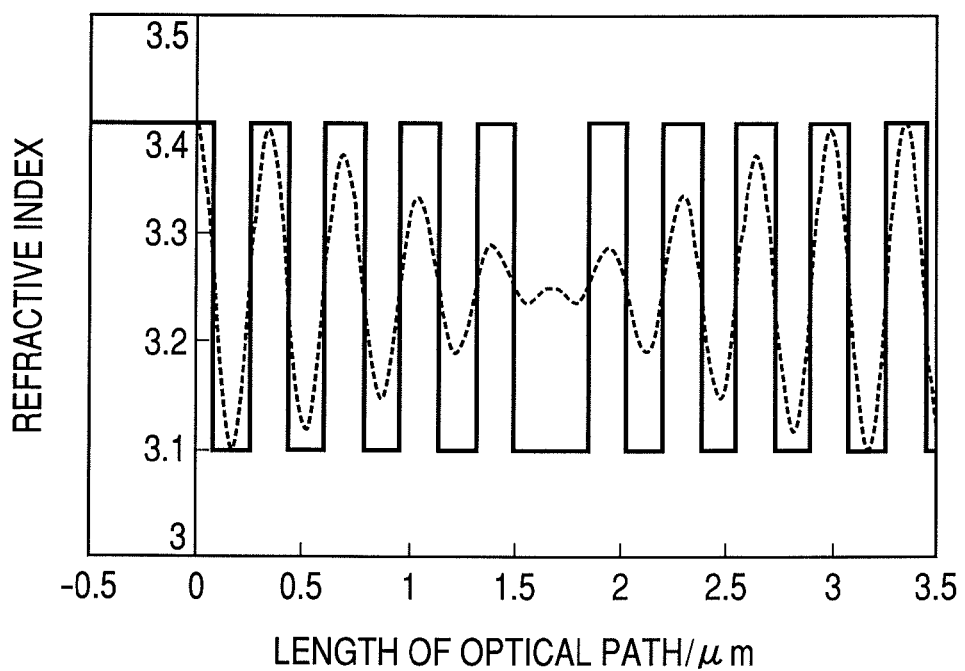
FIG. 12 is a view for describing the refractive-index distribution of the semiconductor multilayer mirror in the embodiments of the present invention.

For example, the multilayer mirror can be configured also by the refractive-index distribution shown by the solid line in FIG. 12. The reflectance when incident at the incident angle θ on the multilayer mirror (lamination of 20 μm in thickness at optical distance) having such refractive-index distribution becomes as shown in FIG. 13. That is, this multilayer mirror has high reflectance peaks at 0° and approximately 24°.

Here, the refractive-index distribution shown by the solid line in FIG. 12 is also configured to have two periods by using the sum of two types of the sine waves as reference, similarly to the fabrication method of the refractive-index distribution shown in FIG. 10. However, the refractive-index takes two values only of 3.1 and 3.4 as the condition.

If the type of the refractive-index of the layer configuring the multilayer mirror is few, the formation of the multilayer mirror becomes much easier. For example, in a compound semiconductor, by changing a composition ratio of constituent elements, the refractive-index can be changed.

However, when considering a process of the crystal growth of the compound semiconductor, it is preferable to reduce the type of the compound semiconductor as much as possible.

When the multilayer mirror having the refractive-index distribution shown by the solid line in FIG. 12 is formed by the compound semiconductor, the composition ratio of two types only are prepared, and crystal growth becomes simpler than the distribution of FIG. 10.

Now, the multilayer mirror showing its reflectance in FIG. 11 can be also expressed as a mirror having a first reflectance peak (0°) showing the highest reflectance and a second reflectance peak (approximately 24°) showing the same reflectance as the first reflectance peak or the second highest reflectance next to the first reflectance peak.

Here, the first reflectance peak showing the highest reflectance may be not necessarily 90% or more. However, when considering that it reaches up to the laser oscillation, the first reflectance peak is preferably 90% or more.

Further, according to the above description, the first reflectance peak corresponds to the first diffracted light, and the second reflectance peak corresponds to the second diffracted light. However, the peak corresponding to the second diffracted light may be configured to be a peak (first reflectance peak) showing the highest reflectance.

Further, the surface emitting laser of the present invention is desirably configured such that a difference between the incident angle of the first reflectance peak and the incident angle of the second reflectance peak exceeds $\arcsin(n_2/n_1)$ in the photonic crystal contacting the dielectric at a part of the boundary face opposite to the substrate side. Here, $n_1$ indicates the refractive-index of the active layer, and $n_2$ indicates the refractive-index of the dielectric to which the photonic crystal contacts.

When the above described condition is satisfied, the second diffracted light is incident at its critical angle or more on the boundary face with the photonic crystal and the dielectric from the substrate side. As a result, the light emitted to the opposite side of the substrate of the photonic crystal structure is limited only to the direction having the relationship with the first diffracted light. Such an embodiment can be said to be a preferable embodiment for the practical use of the surface emitting laser.

When the photonic crystal contacts the air at the opposite side of the substrate, the dielectric to which the photonic crystal contacts is the air, and $n_2$ becomes approximately 1.

First Embodiment

In a first embodiment, a surface emitting laser applied with the present invention will be described.

Figure 14:
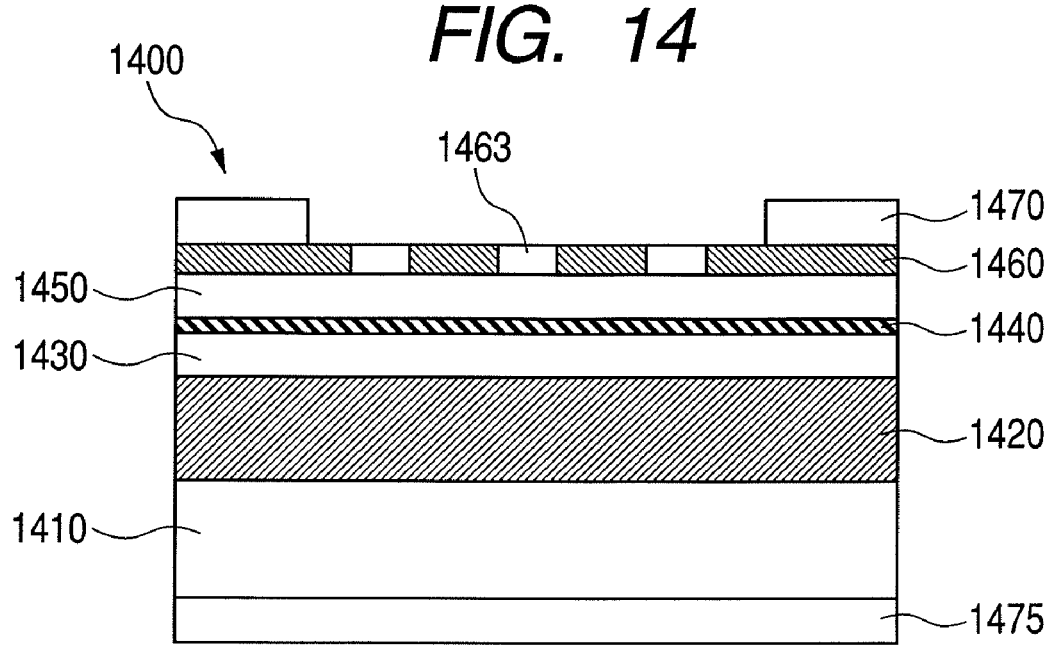
FIG. 14 is a sectional schematic illustration for describing the surface emitting laser in a first embodiment of the present invention.

In FIG. 14 is shown a sectional schematic illustration for describing the surface emitting laser in the present embodiment.

In FIG. 14, reference numeral 1400 denotes a surface emitting laser, numeral 1410 a substrate, numeral 1420 a first semiconductor multilayer mirror, and numeral 1430 a lower spacer layer.

Reference numeral 1440 denotes an active layer, numeral 1450 an upper spacer layer, numeral 1460 a slab layer having a photonic crystal structure, numeral 1470 an upper electrode, and numeral 1475 a lower electrode.

At the time of fabricating the surface emitting laser of the present embodiment, first, the first semiconductor multilayer mirror 1420 made of a plurality of layers changed in an Al composition ratio of an n-AlGaAs layer is grown on the n-GaAs substrate 1410.

A layer configuration of the first semiconductor multilayer mirror 1420 is, for example, one laminating the eight units of a unit made of an AlGaAs layer 18 as shown in the following Table 1.

TABLE 1

| Layer Number | Composition | Thickness (nm) |
|---|---|---|
| 18 | $Al_{0.9}Ga_{0.1}As$ | 57.1 |
| 17 | $Al_{0.5}Ga_{0.5}As$ | 52.2 |
| 16 | $Al_{0.9}Ga_{0.1}As$ | 54.0 |
| 15 | $Al_{0.5}Ga_{0.5}As$ | 52.2 |
| 14 | $Al_{0.9}Ga_{0.1}As$ | 54.0 |
| 13 | $Al_{0.5}Ga_{0.5}As$ | 52.2 |
| 12 | $Al_{0.9}Ga_{0.1}As$ | 57.1 |
| 11 | $Al_{0.5}Ga_{0.5}As$ | 49.3 |
| 10 | $Al_{0.9}Ga_{0.1}As$ | 114.3 |
| 9 | $Al_{0.5}Ga_{0.5}As$ | 49.3 |
| 8 | $Al_{0.9}Ga_{0.1}As$ | 57.1 |
| 7 | $Al_{0.5}Ga_{0.5}As$ | 52.2 |
| 6 | $Al_{0.9}Ga_{0.1}As$ | 54.0 |
| 5 | $Al_{0.5}Ga_{0.5}As$ | 52.2 |
| 4 | $Al_{0.9}Ga_{0.1}As$ | 54.0 |
| 3 | $Al_{0.5}Ga_{0.5}As$ | 52.2 |
| 2 | $Al_{0.9}Ga_{0.1}As$ | 57.1 |
| 1 | $Al_{0.5}Ga_{0.5}As$ | 49.3 |

As a growth method that grows the first semiconductor multilayer mirror 1420, for example, a MOCVD method can be used.

This first semiconductor multilayer mirror 1420 is designed such that, similarly to the refractive-index shown in FIG. 13, the reflectance becomes the maximum when the incident angle from an n-$Al_{0.9}$Ga0.1As lower spacer layer is 0° and approximately 24° for the light of the wavelength 670 nm.

On the first semiconductor multilayer mirror 1420, the n-$Al_{0.9}$Ga0.1As lower spacer layer 1430, and the active layer 1440 including a GaInP/AlGaInP multiple quantum well layer having a thickness enough to form a resonator are grown. Next, the p-$Al_{0.9}Ga_{0.1}$As upper spacer layer 1450, and the p-$Al_{0.5}Ga_{0.5}$As slab layer 1460 are grown. This active layer 1440 has an optical gain at the wavelength 670 nm.

The slab layer 1460 upper surface is coated with resist (not shown), and a two-dimensional tetragonal lattice pattern of 100 nm in diameter and 500 nm in lattice interval is formed on the resist. After developing the resist, by using a reactive ion etching by SiCl4/Ar plasma, the p-AlGaAs slab layer 1460 is formed with the photonic crystal structure made of a two-dimensional hole row 1463.

The slab layer 1460 containing this photonic crystal structure has a presence of the waveguide mode with the first semiconductor multilayer mirror 1420, and moreover, is formed such that the resonance operation occurs by the photonic crystal structure. After forming this hole row, the resist is removed.

The lower electrode 1475 is formed below the substrate 1410, and the upper electrode 1470 is formed on the slab layer 1460. The upper electrode 1470 is, for example, taken as Ti/Au, and the lower electrode 1475 is, for example, taken as AuGe/Au.

When current injection is performed for the surface emitting laser 1400 thus fabricated, the active layer 1440 emits light, and by the laser oscillation by the resonance principle, a surface emission of the wavelength of approximately 670 nm occurs in the vertical direction to the substrate.

Second Embodiment

In a second embodiment, a configuration example provided with a second semiconductor multilayer mirror 1590 different from the first semiconductor multilayer mirror in the first embodiment will be described.

Figure 15:
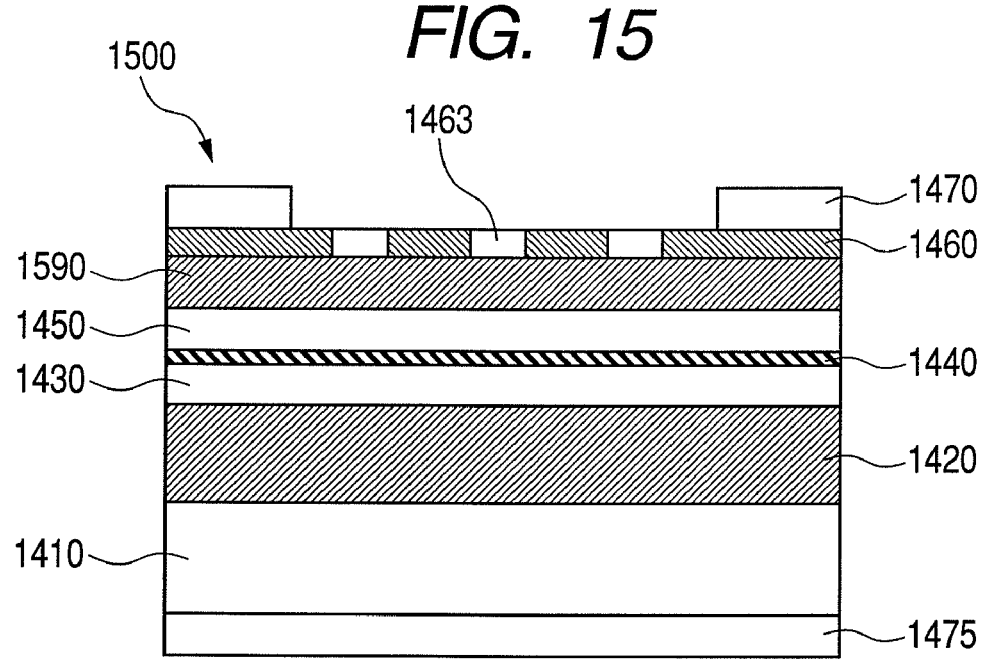
FIG. 15 is a sectional schematic illustration for describing the surface emitting laser in a second embodiment of the present invention.

In FIG. 15 is shown a sectional schematic illustration for describing a surface emitting laser in the present embodiment.

In FIG. 15, the same configuration as the first embodiment shown in FIG. 14 is attached with the same numerals, and therefore, the description of the common portions will be omitted.

In FIG. 15, reference numeral 1500 denotes a surface emitting laser, and numeral 1590 a second semiconductor multilayer mirror.

The surface emitting laser 1500 in the present embodiment, as with the main parts shown in FIG. 15, is provided with the second semiconductor multilayer mirror 1590 between the active layer 1440 in the first embodiment and the slab layer 1460 provided with a photonic crystal.

At that time, the second semiconductor multilayer mirror 1590 has a reflectance, whose light is vertically incident on the semiconductor multilayer mirror, higher than the reflectance when incident at another incident angle for the light of the laser oscillation wavelength.

By nipping the active layer 1440 between such second semiconductor multilayer mirror 1590 and the first semiconductor multilayer mirror 1420 and forming the resonator also in the direction vertical to the substrate, the Q value of the whole laser resonator can be further increased. As a result, the threshold value can be reduced.

To extract an output light of the surface emitting laser from the photonic crystal side (opposite to the substrate side), the vertical incident reflectance of the second semiconductor multilayer mirror 1590 is desirably lower compared with the vertical incident reflectance of the first semiconductor multilayer mirror 1420.

Specifically, between the upper spacer layer 1450 and the slab layer 1460 in the first embodiment, the second semiconductor multilayer mirror laminated with ten pairs of the p-$Al_{0.9}Ga_{0.1}$As layer of 53.2 nm and the p-$Al_{0.5}Ga_{0.5}$As layer of 48.6 nm is formed at the crystal growth time.

While the first and second embodiments have been described as above, the surface emitting laser of the present invention are not limited to these embodiments.

For example, AlGaInN system for 400 nm wavelength band, and InGaAs system for 1 μm wavelength band can be used.

In particular, the semiconductor layer, the photonic crystal, the semiconductor multilayer mirror, the material of the electrode, the lattice shape of the photonic crystal, the semiconductor multilayer mirror, and the like can be appropriately set.

Further, in the present embodiment, though the wavelength of 670 nm has been shown as the laser oscillation wavelength, this is not restrictive, and by the selection of the appropriate material and structure, and the like, the oscillation of the optional wavelength can be made.

The surface emitting laser of the present invention thus described can be also used as the light source to perform the drawing on the photoconductive drum of an image forming apparatus such as a copier and a printer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-266246, filed Oct. 12, 2007, which is hereby incorporated by reference herein in its entirety.

The invention claimed is:

1. A surface emitting laser of an oscillation wavelength $\lambda$ comprised of a lamination of a plurality of semiconductor layers on a substrate, the plurality of semiconductor layers including a first semiconductor multilayer minor, an active layer, and a photonic crystal having a refractive-index distribution in an in-plane direction of the substrate,
   wherein the photonic crystal is configured to diffract an incident light into a first diffracted light and a second diffracted light which is different in diffraction angle from the first diffracted light, when the incident light is of the oscillation wavelength $\lambda$ and is incident from a vertical direction to the in-plane direction,
   wherein the first semiconductor multilayer minor has a stop band for each of the first diffracted light and the second diffracted light, which are diffracted by the photonic crystal,
   wherein the first diffracted light has an angle of zero degree with an incident direction of the incident light, and the second diffracted light has an angle with the incident direction of the incident light larger than zero degree and less than 90 degrees, and
   wherein, when an incident angle of the second diffracted light to a normal line of the first semiconductor multilayer mirror is taken as $\theta$, a layer configuring the first semiconductor multilayer mirror has a thickness that is not an optical thickness of $\lambda/4$ and is not an optical thickness of $\lambda/(4\cdot\cos\theta)$.

2. The surface emitting laser according to claim 1, wherein the first semiconductor multilayer mirror has a period of the refractive-index distribution corresponding to the first diffracted light and a period of the refractive-index distribution corresponding to the second diffracted light.

3. The surface emitting laser according to claim 1, wherein the first semiconductor multilayer mirror is formed by alternately laminating a layer having a first refractive-index and a layer having a second refractive-index different from the first refractive-index.

4. The surface emitting laser according to claim 1, wherein the first semiconductor multilayer mirror includes laminated layers having three or more types of the refractive-index.

5. The surface emitting laser according to claim 1, wherein a reflectance for the first and second diffracted lights in the first semiconductor multilayer minor is 90% or more.

6. The surface emitting laser according to claim 5, wherein the reflectance for the first and second diffracted lights in the first semiconductor multilayer minor is 99% or more.

7. The surface emitting laser according to claim 1, wherein a second semiconductor multilayer mirror is provided between the active layer and the photonic crystal.

8. The surface emitting laser according to claim 7, wherein the second semiconductor multilayer mirror has a structure such that a reflectance when a light of the oscillation wavelength $\lambda$ is vertically incident on the second semiconductor multilayer mirror is higher than a reflectance when incident at another incident angle.

9. A surface emitting laser of an oscillation wavelength $\lambda$ comprised of a lamination of a plurality of semiconductor layers on a substrate, the plurality of semiconductor layers including a first semiconductor multilayer minor, an active layer, and a photonic crystal having a refractive-index distribution in an in-plane direction of the substrate,
   wherein the photonic crystal is configured to diffract an incident light into a first diffracted light and a second diffracted light, which is different in diffraction angle from the first diffracted light, when the incident light is of the oscillation wavelength $\lambda$ and is incident from a vertical direction to the in-plane direction, and
   wherein the first semiconductor multilayer minor is configured to reflect each of the first diffracted light and the second diffracted light, which are diffracted by the photonic crystal, and, when a refractive-index of the active layer is taken as $n_1$ and a refractive-index of a dielectric to which the photonic crystal contacts at a boundary face opposite to a substrate side is taken as $n_2$, a difference of an incident angle with a first reflectance peak, showing a highest reflectance, and an incident angle with a second reflectance peak, showing a same reflectance as the first reflectance peak or a highest reflectance next to the first reflectance peak, is configured to exceed $\arcsin(n_2/n_1)$.

10. The surface emitting laser according to claim 9, wherein the dielectric is air.

11. The surface emitting laser according to claim 9, wherein the first semiconductor multilayer mirror has a period of the refractive-index distribution corresponding to the first diffracted light and a period of the refractive-index distribution corresponding to the second diffracted light.

12. A surface emitting laser of an oscillation wavelength $\lambda$ comprised of a lamination of a plurality of semiconductor layers on a substrate, the plurality of semiconductor layers including a first semiconductor multilayer mirror, an active layer, and a photonic crystal having a refractive-index distribution in an in-plane direction of the substrate,
   wherein the photonic crystal is configured to diffract an incident light into a first diffracted light and a second diffracted light, which is different in diffraction angle from the first diffracted light, when the incident light is of the oscillation wavelength $\lambda$ and is incident from a vertical direction to the in-plane direction,
   wherein the first semiconductor multilayer minor has a stop band for each of the first diffracted light and the second diffracted light, which are diffracted by the photonic crystal,
   wherein a second semiconductor multilayer minor is provided between the active layer and the photonic crystal, and
   wherein the second semiconductor multilayer mirror has a structure such that a reflectance when a light of the oscillation wavelength $\lambda$ is vertically incident on the second semiconductor multilayer mirror is higher than a reflectance when incident at another incident angle.

* * * * *